(12) United States Patent
Byl et al.

(10) Patent No.: US 10,497,532 B2
(45) Date of Patent: Dec. 3, 2019

(54) ION IMPLANTATION PROCESSES AND APPARATUS

(71) Applicant: ENTEGRIS, INC., Billerica, MA (US)

(72) Inventors: Oleg Byl, Southbury, CT (US); Joseph D Sweeney, New Milford, CT (US)

(73) Assignee: ENTEGRIS, INC., Billerica, MA (US)

( * ) Notice: Subject to any disclaimer, the term of this patent is extended or adjusted under 35 U.S.C. 154(b) by 197 days.

(21) Appl. No.: 15/522,490

(22) PCT Filed: Oct. 27, 2015

(86) PCT No.: PCT/US2015/057444
§ 371 (c)(1),
(2) Date: Apr. 27, 2017

(87) PCT Pub. No.: WO2016/069516
PCT Pub. Date: May 6, 2016

(65) Prior Publication Data
US 2017/0338075 A1     Nov. 23, 2017

Related U.S. Application Data

(60) Provisional application No. 62/069,259, filed on Oct. 27, 2014, provisional application No. 62/069,272, (Continued)

(51) Int. Cl.
*H01J 27/20* (2006.01)
*H01J 27/16* (2006.01)
(Continued)

(52) U.S. Cl.
CPC .............. *H01J 27/20* (2013.01); *H01J 27/16* (2013.01); *H01J 37/08* (2013.01);
(Continued)

(58) Field of Classification Search
USPC ...................................................... 250/492.21
See application file for complete search history.

(56) References Cited

U.S. PATENT DOCUMENTS 5,518,528 A    5/1996   Tom et al.
5,886,355 A *   3/1999   Bright ................... H01J 27/022
                                                                              250/423 R
(Continued)

FOREIGN PATENT DOCUMENTS

CN        1181716 A    5/1998
CN        1807705 A    7/2006
(Continued)

*Primary Examiner* — Phillip A Johnston
(74) *Attorney, Agent, or Firm* — Entegris, Inc.

(57) ABSTRACT

An ion source apparatus which generates dopant species in a manner enabling low vapor pressure dopant source materials to be employed. The ion source apparatus (10), comprising: an ion source chamber (12); and a consumable structure in or associated with the ion source chamber (12), said consumable structure comprising a solid dopant source material susceptible to reaction with a reactive gas for release of dopant in gaseous form to the ion source chamber. For example, the consumable structure is a dopant gas feed line (14) comprising a pipe or conduit having an interior layer formed of a solid dopant source material.

15 Claims, 4 Drawing Sheets

Related U.S. Application Data filed on Oct. 27, 2014, provisional application No. 62/069,233, filed on Oct. 27, 2014.

(51) Int. Cl.
  *H01J 37/08* (2006.01)
  *H01L 21/265* (2006.01)
  *H01J 37/317* (2006.01)

(52) U.S. Cl.
  CPC ........ *H01J 37/3171* (2013.01); *H01L 21/265* (2013.01); *H01J 2237/082* (2013.01)

(56) References Cited

U.S. PATENT DOCUMENTS

| | | | |
|---|---|---|---|
| 5,899,733 A * | 5/1999 | Gisdakis | H01L 21/26546 438/528 |
| 6,001,172 A | 12/1999 | Bhandari et al. | |
| 6,005,127 A | 12/1999 | Todd et al. | |
| 6,135,128 A | 10/2000 | Graf et al. | |
| 6,319,565 B1 | 11/2001 | Todd et al. | |
| 6,583,544 B1 * | 6/2003 | Horsky | H01J 27/12 250/492.2 |
| 6,998,626 B1 | 2/2006 | Ryding et al. | |
| 7,586,101 B2 * | 9/2009 | Murrell | H01J 27/08 250/423 R |
| 8,188,448 B2 * | 5/2012 | Benveniste | H01J 37/08 250/492.1 |
| 8,281,738 B2 * | 10/2012 | Devaney | H01J 27/08 118/723 CB |
| 8,796,131 B2 * | 8/2014 | Jones | H01J 37/08 438/607 |
| 2012/0255490 A1 | 10/2012 | Tanjo | |

FOREIGN PATENT DOCUMENTS

| | | |
|---|---|---|
| GB | 2 061 608 B | 3/1983 |
| JP | 62-95820 A | 5/1987 |
| JP | 11-224633 A | 8/1999 |
| KR | 20010022638 A | 3/2001 |
| KR | 10-2012-0106947 A | 9/2012 |
| TW | 473833 B | 1/2002 |
| TW | 574223 B | 2/2004 |
| WO | 97/44118 A1 | 11/1997 |
| WO | 98/52678 A1 | 11/1998 |
| WO | 2009/102762 A2 | 8/2009 |
| WO | 2013/148463 A1 | 10/2013 |
| WO | 2016/069516 A1 | 5/2016 |

* cited by examiner

ION IMPLANTATION PROCESSES AND APPARATUS

CROSS-REFERENCE TO RELATED APPLICATIONS

This application is a U.S. national phase under the provisions of 35 U.S.C. § 371 of International Patent Application No. PCT/US2015/057444 filed Oct. 27, 2015, which in turn claims the benefit of priority under 35 U.S.C. § 119 of U.S. Provisional Patent Application Nos. 62/069,272, 62/069,259, and 62,069,233 filed Oct. 27, 2014 are hereby claimed. The disclosures of such international patent application and U.S. Provisional Patent Application Nos. 62/069,272, 62/069,259, and 62,069,233 are hereby incorporated herein by reference, in their respective entireties, for all purposes.

FIELD

The present disclosure relates in one aspect to ion implantation systems and methods, wherein dopant species are provided or generated in situ to an ion source chamber of an ion implantation apparatus. In another aspect, the disclosure relates to antimony, indium, and gallium precursor compositions, and to ion implantation apparatus and methods utilizing such compositions. In a still further aspect, the disclosure relates to ion implantation systems and processes for ion implantation of antimony.

DESCRIPTION OF THE RELATED ART

In the use of dopant source materials for ionization to form dopant species for ion implantation, a wide variety of dopant source materials for generating dopant species have been developed.

In many cases, the dopant source materials do not have sufficiently high vapor pressure for efficient delivery to the ion source chamber of the ion implantation system. The use of such dopant source materials having low vapor pressure therefore may require substantial tool modification of the ion implantation apparatus, to enable delivery at high temperatures that are required to adequately volatilize the dopant source material and prevent its condensation and deposition in flow lines of the ion implantation system. Vaporizers and flow circuitry accommodating such high temperature operation must therefore be employed.

The use of high temperatures, however, is problematic, since the dopant source materials may be susceptible to decomposition and side reactions that make the ion implant process difficult to control within allowable tolerances, for the production of ion implanted structures and devices. In addition, the use of high temperatures restricts the use of control valves so that vapor flow control is adversely affected. These factors in turn lead to long changeover times from one dopant source material to another, and may also present safety hazards when vaporizers are not isolated from the ambient environment during installation or replacement/refilling of the vaporizer.

The foregoing problems have been encountered in ion implantation of dopant species such as antimony, indium, and gallium, for which the choice of acceptable dopant source materials is limited, due to the relatively small number of feed materials with sufficiently high vapor pressure for efficient delivery to the ion source chamber of the ion implantation system.

The art therefore continues to seek new antimony, indium, and gallium precursor compositions.

It therefore would be a substantial advance in the art to provide new approaches that enable low vapor pressure dopant source materials to be efficiently utilized in ion implantation applications for implanting corresponding dopant species, as in the case of the aforementioned antimony, indium, or gallium dopant species for which relatively few high vapor pressure dopant precursors exist.

SUMMARY

The present disclosure relates to ion implantation apparatus and processes, in which dopant species are generated in a manner enabling low vapor pressure dopant source materials to be employed.

In one aspect, the disclosure relates to an ion source apparatus for ion implantation, comprising: an ion source chamber; and a consumable structure in or associated with the ion source chamber, said consumable structure comprising a solid dopant source material susceptible to reaction with a reactive gas for release of dopant in gaseous form to the ion source chamber.

In another aspect, the disclosure relates to a method of conducting ion implantation, comprising: generating ionized dopant species in an ion source chamber for said ion implantation, wherein the ion source chamber has a consumable structure in associated therewith, and wherein the consumable structure comprises a solid dopant source material susceptible to reaction with a reactive gas for release of dopant in gaseous form to the ion source chamber for ionization therein to form said ionized dopant species, said method comprising contacting the consumable structure with the reactant gas for said generating of ionized dopant species.

In a further aspect, the disclosure relates to a method of improving performance of an ion implantation system with respect to at least one of beam current, ion source life, and glitch rate characteristics thereof, said method comprising: generating ionized dopant species in an ion source chamber of said ion implantation system, wherein the ion source chamber has a consumable structure in associated therewith, and wherein the consumable structure comprises a solid dopant source material susceptible to reaction with a reactive gas for release of dopant in gaseous form to the ion source chamber for ionization therein to form said ionized dopant species, said method comprising contacting the consumable structure with the reactant gas for said generating of ionized dopant species.

A still further aspect of the disclosure relates to a method of generating an antimony, indium, or gallium precursor in situ in a process system in which the precursor is utilized, said method comprising providing an antimony, indium, or gallium reactant for said precursor in the process system, and flowing a gaseous co-reactant for the precursor in contact with the antimony, indium, or gallium reactant to form the precursor in situ in the process system.

The present disclosure also relates to antimony, indium, and gallium precursor compositions having utility for ion implantation and other semiconductor manufacturing and industrial applications.

In one aspect, the disclosure relates to a method of improving ion source life in an ion implantation system receiving at least one of antimony, indium and gallium precursor gases for generation of corresponding ionized dopant species, said method comprising co-flowing to an ion source chamber of the ion implantation system a co-flow gas that is effective to improve ion source life of the ion implantation system, wherein when the precursor gas is non-halogenated, the co-flow gas comprises a halogen-containing co-flow gas, and wherein when the precursor gas comprises a halogen-containing precursor, the co-flow gas is non-halogenated, optionally wherein at least one of the precursor gas, and co-flow gas when comprising a co-species gas, is isotopically enriched above natural abundance in at least one isotope thereof.

In a further aspect, the disclosure relates to a gas supply kit for ion implantation, comprising: a first gas supply package containing at least one of antimony, indium, and gallium precursors, wherein the first gas supply package is configured to dispense the precursor in gaseous form; a second gas supply package containing a co-flow gas that when co-flowed to an ion source of an ion implanter with the gaseous precursor, is effective to improve ion source life, wherein when the precursor is non-halogenated, the co-flow gas comprises a halogen-containing co-flow gas, and wherein when the precursor gas comprises a halogen-containing precursor, the co-flow gas is non-halogenated, optionally wherein at least one of the precursor gas, and co-flow gas when comprising a co-species gas, is isotopically enriched above natural abundance in at least one isotope thereof.

In a further aspect, the disclosure relates to a method of enhancing ion source life in ion implantation facilities, comprising supplying for use in the ion implantation facilities a gas supply kit as described above.

A further aspect of the disclosure relates to a gallium ion implantation process, comprising ionizing a gallium precursor to form gallium implant species, and implanting the gallium implant species in a substrate, wherein the gallium precursor comprises one or more precursor material selected from the group consisting of: (i) gallium halides selected from the group consisting of $GaF_3$, $GaCl_3$, $GaCl_2$, $GaBr_2$, and $GaI_3$; (ii) gallium hydrides selected from the group consisting of $GaH_3$, $Ga_2H_6$, and polymeric gallium hydrides comprising repeating units of the formula —$(GaH_3)$—; (iii) gallium adducts of the formula $L:GaR_3$ wherein L is an adducting group, and R is H or $C_1$-$C_{12}$ alkyl; (iv) alkylgallium compounds of the formula $GaR_3$ wherein R is $C_1$-$C_{12}$ alkyl; (v) chloroalkylgallanes of the formula $GaCl_yR_{3-y}$ wherein y is 1 or 2, and R is H or $C_1$-$C_{12}$ alkyl; and (vi) isotopically enriched analogs of (i) to (v) comprising gallium isotopically enriched above natural abundance in $^{69}Ga$ or $^{71}Ga$.

A still further aspect of the disclosure relates to an ion source apparatus for gallium ion implantation, comprising: an ion source chamber; and a source of gallium precursor configured for delivery of the gallium precursor to the ion source chamber, wherein the source of gallium precursor comprises one or more precursor material selected from the group consisting of: (i) gallium halides selected from the group consisting of $GaF_3$, $GaCl_3$, $GaCl_2$, $GaBr_2$, and $GaI_3$; (ii) gallium hydrides selected from the group consisting of $GaH_3$, $Ga_2H_6$, and polymeric gallium hydrides comprising repeating units of the formula —$(GaH_3)$—; (iii) gallium adducts of the formula $L:GaR_3$ wherein L is an adducting group, and R is H or $C_1$-$C_{12}$ alkyl; (iv) alkylgallium compounds of the formula $GaR_3$ wherein R is $C_1$-$C_{12}$ alkyl; (v) chloroalkylgallanes of the formula $GaCl_yR_{3-y}$ wherein y is 1 or 2, and R is H or $C_1$-$C_{12}$ alkyl; and (vi) isotopically enriched analogs of (i) to (v) comprising gallium isotopically enriched above natural abundance in $^{69}Ga$ or $^{71}Ga$.

Another aspect of the present disclosure relates to an ion implantation process, comprising ionizing a precursor to form implant species, and implanting the implant species in a substrate, wherein the precursor comprises one or more precursor material selected from the group consisting of: antimony precursors isotopically enriched above natural abundance in one of $^{121}Sb$ and $^{132}Sb$; indium precursors isotopically enriched above natural abundance in one of $^{113}In$ and $^{115}In$; and gallium precursors isotopically enriched above natural abundance in one of $^{69}Ga$ and $^{71}Ga$.

The disclosure in another aspect relates to a method of enhancing operation of an ion implantation system for implantation of at least one of antimony, indium, or gallium, such method comprising supplying for use in the system corresponding precursor material selected from the group consisting of: antimony precursors isotopically enriched above natural abundance in one of $^{121}Sb$ and $^{132}Sb$; indium precursors isotopically enriched above natural abundance in one of $^{113}In$ and $^{115}In$; and gallium precursors isotopically enriched above natural abundance in one of $^{69}Ga$ and $^{71}Ga$.

In yet another aspect, the disclosure relates to an ion implantation system for implantation of at least one of antimony, indium, or gallium, such system comprising an ion source chamber, and a source of corresponding precursor material configured to provide the corresponding precursor material for ionization in the ion source chamber to generate corresponding implant species, wherein the source of corresponding precursor material comprises corresponding precursor material selected from the group consisting of: antimony precursors isotopically enriched above natural abundance in one of $^{121}Sb$ and $^{132}Sb$; indium precursors isotopically enriched above natural abundance in one of $^{113}In$ and $^{115}In$; and gallium precursors isotopically enriched above natural abundance in one of $^{69}Ga$ and $^{71}Ga$.

The present disclosure additionally relates to ion implantation of antimony, and corresponding systems and processes.

In one aspect, the disclosure relates to an antimony ion implant process, comprising supplying antimony precursor to an ion source of an ion implantation system, for generation of antimony ions for implantation, wherein the antimony precursor comprises at least one of (i) $SbH_3$ and (ii) one or more deuterated analogs thereof, and wherein: when the antimony precursor comprises $SbH_3$, the antimony precursor is supplied from a source wherein the antimony precursor is maintained in an adsorbed state at temperature that minimizes or eliminates decomposition, and is desorbed and flowed to the ion source for said supplying; and when the antimony precursor comprises one or more deuterated analogs of $SbH_3$, the ion implantation system is configured to operate below an extraction voltage level at which neutron-generating nuclear reactions occur, optionally wherein the antimony precursor is supplied from a source wherein the antimony precursor is maintained in an adsorbed state, and is desorbed and flowed to the ion source for said supplying.

In another aspect, the disclosure relates to an antimony ion implantation system, comprising an ion source and a package of antimony precursor arranged to supply the antimony precursor to the ion source, wherein the antimony precursor in said package comprises at least one of (i) $SbH_3$ and (ii) one or more deuterated analogs of $SbH_3$, and wherein: when the antimony precursor comprises $SbH_3$, the package contains the antimony precursor in an adsorbed state, and the system comprises a refrigeration source configured to maintain the antimony precursor in the package at temperature that minimizes or eliminates decomposition, with the package being configured for desorption of the antimony precursor and discharge of the antimony precursor from the package for supply to the ion source; and when the antimony precursor comprises one or more deuterated analogs of SbH$_3$, the ion implantation system is configured to operate below an extraction voltage level at which neutron-generating nuclear reactions occur.

Other aspects, features and embodiments of the disclosure will be more fully apparent from the ensuing description and appended claims.

DETAILED DESCRIPTION

The present disclosure relates to ion implantation, and in various aspects to apparatus and method in which dopant species are generated in a manner enabling low vapor pressure dopant source materials to be employed.

In one aspect, the disclosure relates to an ion source apparatus for ion implantation, comprising: an ion source chamber; and a consumable structure in or associated with the ion source chamber, said consumable structure comprising a solid dopant source material susceptible to reaction with a reactive gas for release of dopant in gaseous form to the ion source chamber.

The consumable structure in the ion source apparatus may comprise a structural member disposed in the ion source chamber, such as a liner or other structural components of the ion source chamber, or the consumable structure may be a structure that is associated with the ion source chamber, such as a gas delivery tube coupled to the ion source chamber, or other structural component of an associated character that is constructed and arranged to provide dopant in gaseous form as a result of reaction with reactive gas contacted with the structural component. The structure is such as to be consumable by reaction with the reactant gas to form the precursor, without adverse effect on the physical integrity of the ion source apparatus or ancillary equipment, i.e., even if the structural member were to be completely consumed, the ion source chamber and ancillary equipment would maintain their physical integrity. For example, the consumable structure may comprise a tubular member that is coaxial with a co-reactant gas flow passage, wherein the consumption of the consumable tubular member does not impair the physical integrity of the co-reactant gas flow passage in which the consumable tubular member is disposed. The consumable structure therefore comprises a physical mass, and may be of sheet, rod, tubular, ring, disc, or other appropriate form, as a target for the reactant gas.

The solid dopant source material utilized in the ion source apparatus may comprise a dopant component selected from the group consisting of antimony, indium, and gallium. Thus, the solid dopant source material may comprise an antimony dopant precursor, an indium dopant precursor, and/or a gallium dopant precursor.

The reactive gas that is utilized in the operation of such apparatus may be of any suitable type, which is effective to react with the solid dopant source material to release dopant in gaseous form to the ion source chamber. Illustrative gases suitable for such purpose include gas selected from the group consisting of hydrogen fluoride, NF$_3$, oxygen, hydrogen, and mixtures of two or more of the foregoing.

The ion source apparatus therefore may be configured, as comprising a source of the reactive gas coupled in gas delivery relationship to the ion source chamber.

The solid dopant source material in various embodiments may comprise isotopically enriched dopant source material, isotopically enriched above natural abundance in at least one isotope thereof.

A further aspect of the disclosure relates to a method of conducting ion implantation, comprising: generating ionized dopant species in an ion source chamber for said ion implantation, wherein the ion source chamber has a consumable structure in associated therewith, and wherein the consumable structure comprises a solid dopant source material susceptible to reaction with a reactive gas for release of dopant in gaseous form to the ion source chamber for ionization therein to form said ionized dopant species, said method comprising contacting the consumable structure with the reactant gas for said generating of ionized dopant species.

In such method, the consumable structure may comprise a structural member disposed in the ion source chamber, such as a liner or other structural member of the ion source chamber. The consumable structure may alternatively, or additionally, comprise a structure that is associated with the ion source chamber, e.g., a gas delivery tube that is coupled to the ion source chamber.

The solid dopant source material comprised in the consumable structure may be of any suitable type, and may for example comprise a dopant component that is selected from the group consisting of antimony, indium, and gallium. Accordingly, the solid dopant source material may comprise an antimony dopant precursor, a gallium dopant precursor, or an indium dopant precursor.

The solid dopant source material comprising the consumable structure may in various embodiments comprise solid dopant source material that is isotopically enriched above natural abundance in at least one isotope thereof.

The reactive gas that is utilized for reaction with the solid dopant source material of the consumable structure may be of any suitable type, which is reactive with the solid dopant source material to produce dopant in gaseous form for ionization and subsequent implantation in the operation of the ion implantation system. In specific embodiments, the reactive gas may comprise gas selected from the group consisting of hydrogen fluoride, NF$_3$, oxygen, hydrogen, and mixtures of two or more of the foregoing.

A further aspect of the disclosure relates to a method of improving performance of an ion implantation system with respect to at least one of beam current, ion source life, and glitch rate characteristics thereof, said method comprising: generating ionized dopant species in an ion source chamber of said ion implantation system, wherein the ion source chamber has a consumable structure in associated therewith, and wherein the consumable structure comprises a solid dopant source material susceptible to reaction with a reactive gas for release of dopant in gaseous form to the ion source chamber for ionization therein to form said ionized dopant species, said method comprising contacting the consumable structure with the reactant gas for said generating of ionized dopant species.

The solid dopant source material utilized in such method may comprise an isotopically enriched dopant source material, isotopically enriched above natural abundance in at least one isotope thereof.

In another aspect, the disclosure relates to a method of generating an antimony, indium, or gallium precursor in situ in a process system in which the precursor is utilized, said method comprising providing an antimony, indium, or gallium reactant for said precursor in the process system, and flowing a gaseous co-reactant for the precursor in contact with the antimony, indium, or gallium reactant to form the precursor in situ in the process system.

The location of the precursor reactant in the process system may be of any suitable location at which such reactant can be reacted with the gaseous co-reactant to produce the precursor for ionization to generate implant species. As previously described, the precursor reactant may be structurally constituted in the process system, or may be otherwise disposed or presented for reaction to generate the desired precursor for ionization to form suitable implant species.

In various embodiments, the process system may comprise an ion implantation system in which the antimony, indium, or gallium reactant is incorporated in an arc chamber of the ion implantation system, in a structural component or otherwise as a presented reactant for reaction to form the corresponding precursor.

The process system may comprise a semiconductor process system, e.g., an ion implantation system, or other process system, such as a process system for manufacturing solar panels or flat-panel display products.

As one example of an illustrative embodiment, the precursor may comprise an antimony precursor generated in situ from an antimony reactant such as elemental antimony (Sb) or $Sb_2O_3$.

The gaseous co-reactant may be of any suitable type that is reactive with the precursor reactant to form the precursor for ionization to generate implant species. In various embodiments, the gaseous co-reactant may comprise a fluorine-containing gaseous compound, e.g., a gaseous compound selected from the group consisting of $XeF_2$, $F_2$, $NF_3$, and $N_2F_4$. In other embodiments, the gaseous co-reactant may comprise a chlorine-containing gaseous compound, e.g., $Cl_2$ or other chloro compound.

The precursor thus may for example comprise a compound selected from the group consisting of $SbF_3$, $SbCl_3$, $GaCl_3$, and $InCl_3$.

In the aforementioned method, flow rate of the gaseous co-reactant may be controlled to achieve a controlled flow rate of the precursor that is produced as a reaction product in the process system.

In various specific embodiments, an antimony, indium, or gallium reactant may be contained in a reactor in the process system, e.g., a heated reactor. The process system a correspondingly comprise an ion implantation system, wherein the reactor temperature gaseous co-reactant flow rate are controlled to achieve a predetermined ion implantation beam current.

The aforementioned method may be carried out in a manner in which the formation of the precursor in situ is controlled by a control process including at least one of: (i) measurement of amount of the precursor formed by contact of the gaseous co-reactant with the antimony, indium, or gallium reactant; (ii) identification and quantitation of reaction products of the contact of the gaseous co-reactant with the antimony, indium, or gallium reactant, (iii) detection of amount of unreacted gaseous co-reactant subsequent to said contact, and (iv) detection of beam current, wherein the process system comprises an ion implantation system.

In other embodiments in which a dedicated reactor is employed, the reactor can comprise multiple reactor beds arranged for switching co-reactant gas flow from one of said multiple reactor beds when reaching an endpoint condition of depletion of the antimony, indium, or gallium reactant, to another of said multiple reactor beds containing the antimony, indium, or gallium reactant.

In such multi-bed reactor arrangement, the endpoint condition for switching may be determined by one or more of: achievement of a predetermined detection of totalized gaseous co-reactant flow; detecting a declining beam current; and analysis of exiting gases from an on-stream one of the multiple reactor beds.

The above-described method may additionally utilize a precursor reactant, e.g. an antimony, indium, or gallium reactant, that is enriched above natural abundance in at least one isotope thereof.

In other embodiments, the method described above may be carried out, in which a co-flow gas is flowed to or through the process system, e.g., a diluent, equilibrium-directing gas, cleaning gas, etc., as desired.

Figure 1:
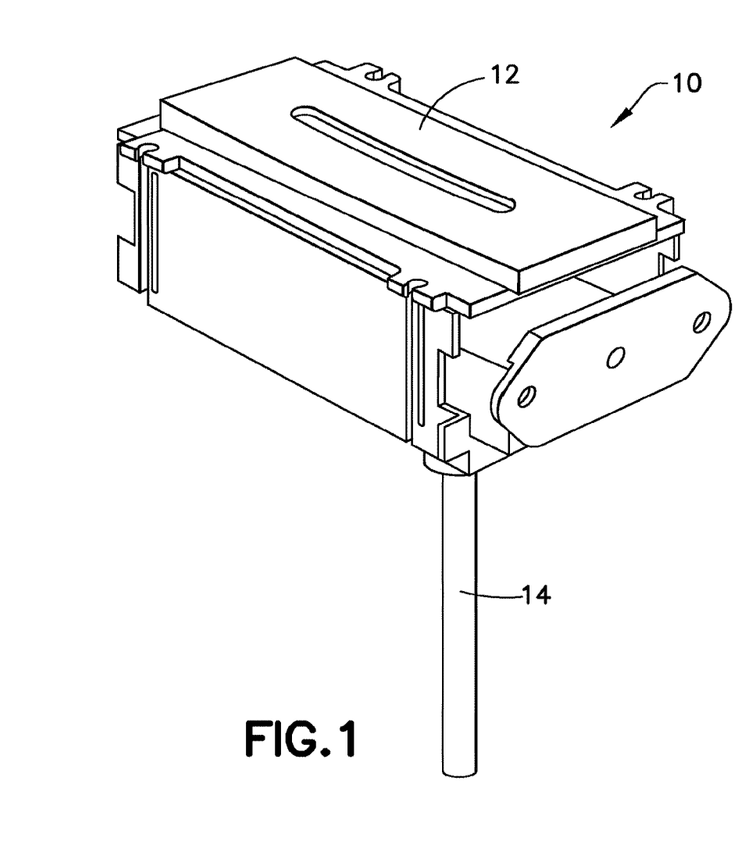
FIG. 1 is a schematic representation of an ion implantation system, including an arc chamber with a gas feed line for feeding dopant source gas to the arc chamber for ionization thereof in the chamber.

Referring now to the drawings, FIG. 1 is a schematic representation of an ion implantation system 10, including an arc chamber 12 with a gas feed line 14 for feeding dopant source gas to the arc chamber for ionization thereof in the chamber. The arc chamber 12 thus provides an ion source chamber in which or associated with the chamber a consumable structure comprising a solid dopant source material may be provided, which is susceptible to reaction with the reaction gas for release of dopant in gaseous form to the chamber.

Figure 2:
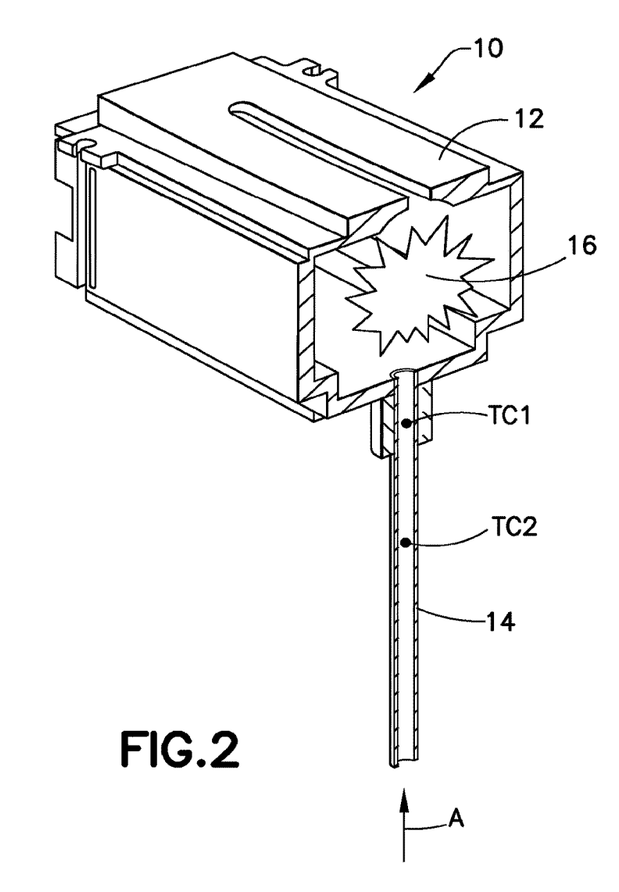
FIG. 2 is a cross section of the FIG. 1 ion implantation system schematically showing the generation of a plasma in the arc chamber of such system.

FIG. 2 is a cross section of the FIG. 1 ion implantation system 10 schematically showing the generation of a plasma 16 in the arc chamber 12 of such system. The dopant gas is flowed in the direction indicated by arrow A into the dopant gas feed line 14, having monitoring thermocouples TC1 and TC2 secured thereto in monitoring relationship to determine the quality of the thermal state of the feed line and gas entering the arc chamber, as may be desirable in connection with the use of a thermal management system for the ion implantation system. The dopant gas feed line 14 may comprise a pipe or conduit having an interior layer formed of a solid dopant source material that is susceptible to reaction with a reactive gas for release of dopant in gaseous form to the ion source chamber. In such manner, a reactive carrier gas may be flowed through the dopant gas feed line, and reactively generate the dopant species. The dopant species and are transported by the carrier gas into the ion source chamber of the ion implantation system.

Figure 3:
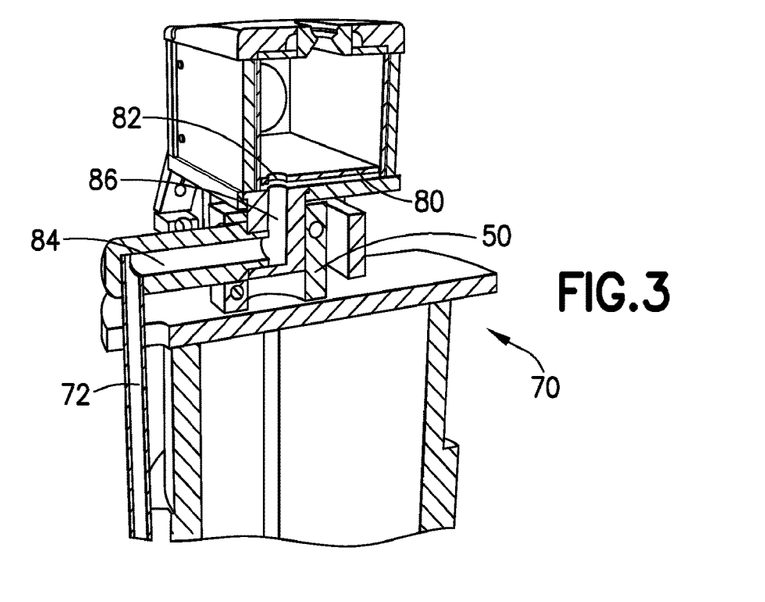
FIG. 3 is a perspective view, in cross-section, of an ion source assembly comprising an ion source apparatus and heat sink apparatus for thermal management of the ion source apparatus.

FIG. 3 is a perspective view, in cross-section, of the ion source assembly comprising the ion source apparatus 70 and an optional heat sink apparatus 50 for thermal management of the system. This cross-sectional view shows the dopant source gas feed line 72 connecting to gas flow passage 84 in the gas feed plug and to the gas flow passage 86 in the gas bushing associated with the ion source.

The ion source apparatus shown in FIG. 3 includes a base liner 80 which may be formed of a solid dopant source material susceptible to reaction with a reactive gas for release of dopant in gaseous form to the ion source chamber, as an in situ generation approach to providing the dopant to the ion source chamber. The liner 80 may be modified to include an opening 82 therein, to provide further improved ion source operating life when decomposition-susceptible dopant source gases are utilized.

The foregoing arrangements illustrate the provision of a consumable structure in or associated with the ion source chamber, comprising the solid dopant source material susceptible to reaction with a reactive gas for release of dopant in gaseous form to the ion source chamber. The consumable structure may be monitored for operating life, and replaced according to an ongoing maintenance schedule, as a consumable component of the ion implantation system.

Figure 4:
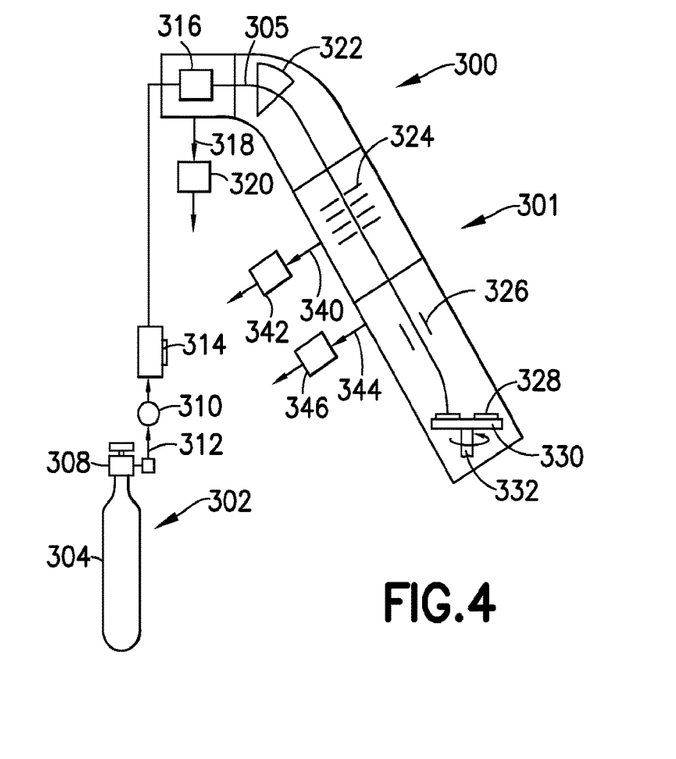
FIG. 4 is a schematic representation of an ion implant process system including a storage and dispensing vessel containing gas which is supplied for ion implantation doping of a substrate in the illustrated ion implant chamber.

FIG. 4 is a schematic representation of an ion implant process system 300 including a storage and dispensing vessel 302 holding a co-reactant gas which is supplied for in situ reaction with a dopant source reactant in the ion source chamber to generate dopant species for ion implantation doping of a substrate 328 in the illustrated ion implant chamber 301.

The storage and dispensing vessel 302 comprises a vessel wall 306 enclosing an interior volume holding the co-reactant gas.

The vessel may be a gas cylinder of conventional type, with an interior volume arranged to hold only gas, or alternatively, the vessel may contain a sorbent material having sorptive affinity for the co-reactant gas, and from which the co-reactant source gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc.

The ion implant chamber 301 contains an ionizer 316 receiving the dispensed co-reactant gas from line 312 that is reactive with the dopant source reactant provided in or in association with the ionizer chamber to generate dopant species that under the ionization conditions in the ionizer chamber produce an ion beam 305. The ion beam 305 passes through the mass analyzer unit 322 which selects the ions needed and rejects the non-selected ions.

The selected ions pass through the acceleration electrode array 324 and then the deflection electrodes 326. The resultingly focused ion beam is impinged on the substrate element 328 disposed on the rotatable holder 330 mounted in turn on spindle 332, to form a doped substrate as the ion implantation product.

The respective sections of the ion implant chamber 301 are exhausted through lines 318, 340 and 344 by means of pumps 320, 342 and 346, respectively.

Figure 5:
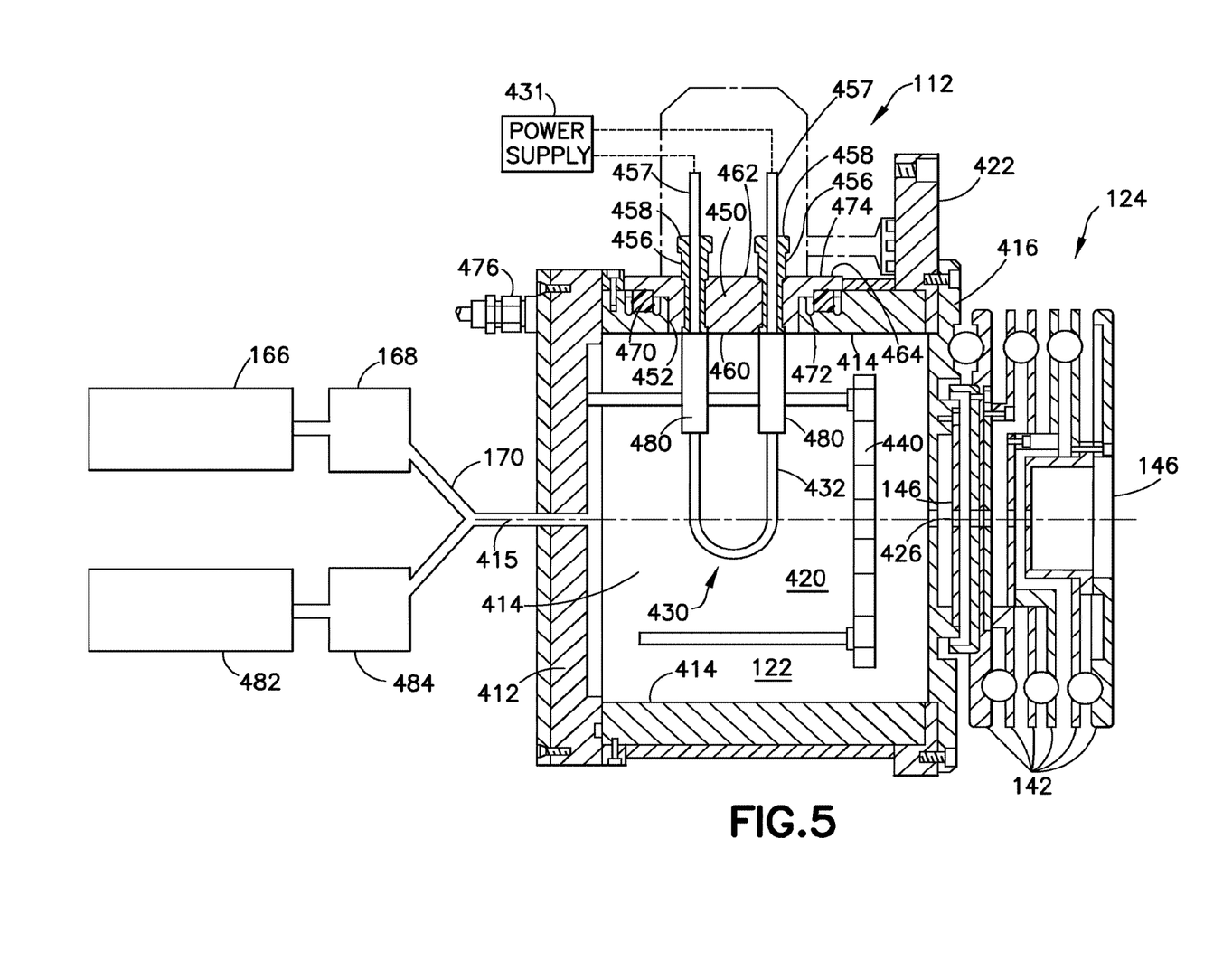
FIG. 5 is a cross-sectional view of an ion source of an ion implantation system.

FIG. 5 is a cross-sectional view of an ion source such as may be usefully employed in an ion implantation system of the type shown in FIG. 4, and which is more fully described in U.S. Pat. No. 6,135,128 issued Oct. 24, 2000 to M. A. Graf, et al.

The ion source 112 comprises a housing which defines a plasma chamber 122, and an ion extractor assembly. Energy is imparted to the ionizable dopant gas that is formed by the dopant source reactant and co-reactant gas, to generate ions within the plasma chamber 122. Generally, positive ions are generated, although the system alternatively may be arranged to generate negative ions. The positive ions are extracted through a slit in the plasma chamber 122 by the ion extractor assembly 124, which comprises a plurality of electrodes 142. Accordingly, the ion extractor assembly functions to extract a beam of positive ions from the plasma chamber through an extraction aperture plate 146 and to accelerate the extracted ions toward a mass analysis magnet (not shown in FIG. 5).

Co-reactant gas may be flowed from a source 166 of such gas and is injected into the plasma chamber 122 containing the dopant source reactant or having the dopant source reactant associated therewith, through conduit 170 containing mass flow controller 168 therein. The source 166 may include a sorbent-based gas storage and supply vessel, e.g., of a type as commercially available from Entegris, Inc. (Billerica, Mass., USA) under the trademark SDS, a pressure-regulated vessel including an internal gas pressure regulator, e.g., of a type commercially available from Entegris, Inc. (Billerica Mass., USA) under the trademark VAC, or, when a solid co-reactant material is employed, the source 166 may include a solid source vessel, e.g., of a type as commercially available from Entegris, Inc. (Billerica, Mass., USA) under the trademark ProE-Vap. The plasma chamber 122 has electrically conductive chamber walls 412, 414, 416 that bound an ionization zone 420 in the chamber interior for ionization of the reaction product of the dopant source reactant and co-reactant gas. Side wall 414 is circularly symmetric about a center axis 415 of the plasma chamber 122. A conductive wall 416 that faces a resolving magnet is connected to a plasma chamber support 422. Wall 416 supports the aperture plate 146 having multiple openings that allow ions to exit the plasma chamber 122 and then combine to form the ion beam at a location downstream from multiple spaced apart and electrically isolated extraction electrodes 124. The aperture plate 146 includes a number of openings arranged in a specified pattern that align with similarly configured multiple apertures in the spaced-apart extraction electrodes 142. Only one such aperture is shown in FIG. 5.

A metallic antenna 430 has a metal surface 432 exposed within the chamber interior for emitting energy into the plasma chamber 122. A power supply 434 outside the plasma chamber 122 energizes the metallic antenna 430 with a radio frequency (RF) signal of suitable character, e.g., an RF signal of approximately 13.56 megahertz (MHz), to set up an alternating electric current in the metallic antenna to induce an ionizing electric field within the plasma chamber 122. The power of the antenna may be of any suitable magnitude suitable for the specific ionization operation, e.g., a power on the order of 500-3000 watts (W). The pressure in the source chamber can for example be on the order of 1-10 millitorr, so that the source 112 functions as a low pressure, high-density inductive source. The plasma chamber 122 may also include a magnetic filter assembly 440 extending through a region of the chamber interior between the antenna 430 and the aperture plate 146.

The antenna 430 can be positioned within the plasma chamber 122 by a removable support plate 450. The support plate 450 is supported by the side wall 414 at a location having a circular cutout 452 through which the antenna extends. A support plate 450 for the antenna 430 is sized to fit within the cutout 452 in the chamber wall 414 while positioning the exposed U-shaped metal portion 432 of the antenna 430 within the ionization zone 420.

The support plate 450 defines two through passageways that accommodate two vacuum pressure fittings 456. After elongated leg segments 457 of the antenna 430 are pushed through the fittings, end caps 458 are screwed onto the fittings to seal the region of contact between the fittings 456 and the leg segments 457. The antenna 430 is preferably U-shaped in its radiation-emitting region and may for example be constructed from aluminum. The tube has an outer diameter dimensioned to pass through the pressure fittings 456. While in use the antenna absorbs the heat from its surroundings. To dissipate this heat a coolant is routed through the center of the tube.

The plate 450 has a generally planar surface 460 that is exposed to an interior of the plasma chamber and includes a parallel outer surface 462 that faces away from the chamber interior. A flanged portion 464 of the plate 450 overlies a ring magnet 470 that surrounds the cutout in the wall 414 and that is attached to the wall 414 by connectors 472. A ferromagnetic insert 474 attached to the support plate 450 fits over the magnet 470 so that as the plate 450 is positioned within the cutout 452, the ferromagnetic insert 474 and the magnet 470 attract each other to secure the plate 450 in position with the antenna 430 extending into the chamber interior.

During operation of the ion source, heat is generated and this heat is absorbed by the walls 412, 414, 416, 418. The absorbed heat can be removed from the chamber 122 by a coolant that is introduced through a fitting 476 for routing water into a passageway through the walls and away from the chamber by a second exit fitting (not shown). By this arrangement, the temperature of the walls may be maintained at temperature below 100° C., so that the ion source 112 functions as a cold walled ion source.

A region of the antenna 430 near the support plate 450 is particularly susceptible to coating with sputtered material during operation of the ion implanter. To minimize the effect of such sputtering, two shields 480 can be slipped over the aluminum antenna before the antenna is inserted into the support plate 450. These shields are preferably constructed from aluminum and are maintained in place by a friction fit between the shields and the outer surface of the exposed aluminum of the antenna 430.

During operation of the ion source 112, deposits of dopant elements may form on the interior walls 412, 414 and 416 that bound the ionization zone 420. A cleaning gas may be flowed simultaneously with the co-reactant gas while the ion source 112 is operated under normal operating conditions. A cleaning gas source 482 and a corresponding mass flow controller 484 may be provided, with the cleaning gas output of the mass flow controller 484 being combined with the co-reactant gas output of the mass flow controller 168 in conduit 170 prior to being delivered to the plasma chamber 122. Alternatively, the co-reactant gas and the cleaning gas may be delivered separately to the plasma chamber. As a further alternative, the cleaning gas may be flowed to the plasma chamber subsequent to the active ion implantation operation thereof.

It will be recognized that the co-reactant gas source 166 may contain the co-reactant gas in combination with cleaning material and/or other materials, such as diluents, equilibrium-directing materials, coolants, etc.

Figure 6:
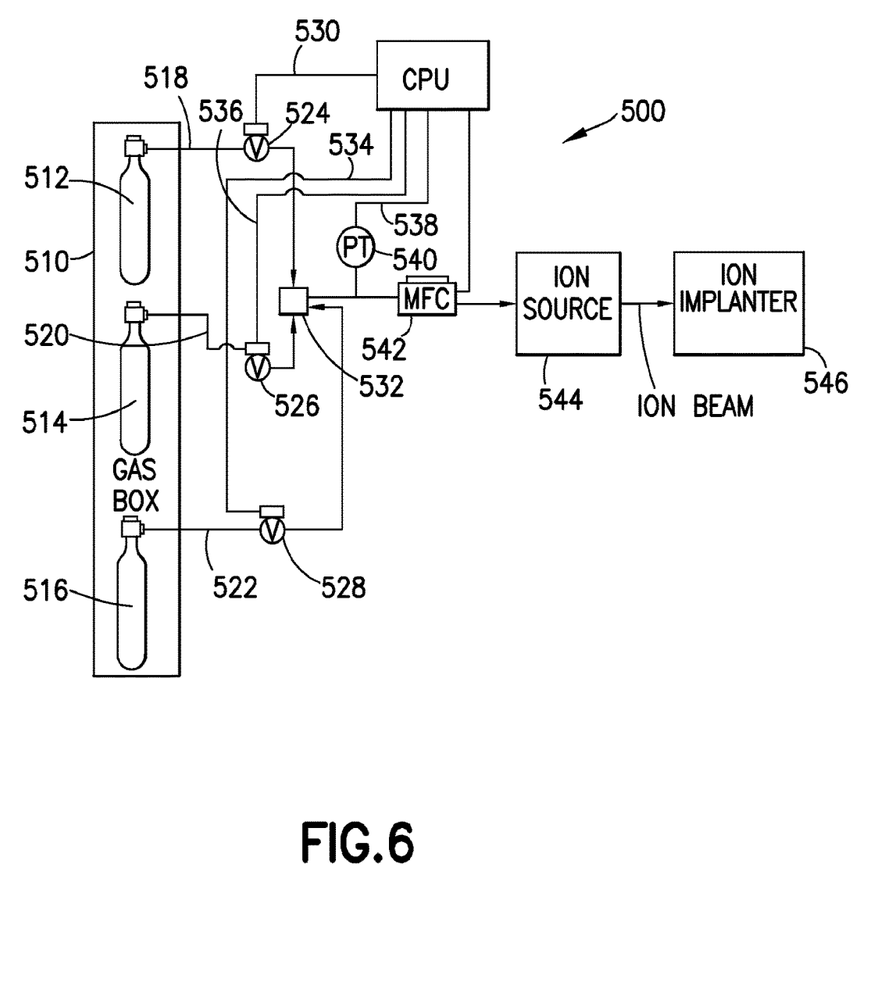
FIG. 6 is a schematic representation of an ion implantation system comprising a process monitoring and control system.

FIG. 6 is a schematic representation of an ion implantation system 500 comprising an ion source chamber 544 and a process monitoring and control system.

As shown, the ion implantation system 500 includes a gas box 510 in which are disposed gas supply cylinders including a co-reactant gas cylinder 512, coupled to dispensing line 518 having flow control valve 524 therein, a cleaning fluid cylinder 514 coupled to dispensing line 520 having a flow control valve 526 therein, and a diluent fluid cylinder 516 coupled to dispensing line 522 having flow control valve 528 therein. The co-reactant gas in cylinder 512 is arranged for reaction with a dopant source reactant provided in or associated with the ion source chamber 544 (not shown in FIG. 6).

The valves 524, 526 and 528 are connected to a central processing unit (CPU) by signal transmission lines 530, 536 and 534, respectively, whereby the CPU can operate to open or close the respective valves to a specific extent in response to a cycle time program, or other signal generating capability of the CPU that provides a valve-modulating response to process conditions and/or components monitored by the CPU.

The dispensing lines 518, 520 and 522 coupled to the respective cylinders terminate at a mixing chamber 532, so that multiple ones of the respective co-reactant gas, cleaning fluid and diluent fluid can be selectively mixed with one another, as desired. Alternatively, a single cylinder, viz., the co-reactant gas cylinder 512, may be arranged to dispense its contents to chamber 532, for flow therefrom to the feed line containing pressure transducer 540 and mass flow controller (MFC) 542 therein, and thence to the ion source chamber 544. The ion source chamber 544 is arranged for ionization operation, to ionize the dopant source therein that is produced by reaction of the co-reactant gas and the dopant source reactant. The ionization operation is conducted to produce an ion beam that is transmitted to the ion implanter chamber 546. The ion implanter chamber 546 contains a semiconductor or other microelectronic device substrate mounted therein for implantation of the selected ionized dopant species in the substrate.

In this illustrative system of FIG. 6, the pressure transducer 540 in the feed line to the ion source is joined in signal transmission relationship to the CPU by signal transmission line 538. The mass flow controller also is joined in signal transmission relationship to the CPU by a signal transmission line. By this arrangement of the pressure transducer, a signal is generated that is correlative of the pressure in the feed line, and transmitted in line 538 to the CPU for monitoring purposes.

During the flow of co-reactant gas to the ion source, pressure in the feed line is sensed by the pressure transducer 540 and transmitted in signal transmission line 538 to the CPU.

The CPU then responsively can modulate flow of the co-reactant gas to the ion source chamber. The CPU also can control flow of the cleaning fluid into the feed line from cylinder 514 by opening the flow control valve 526 by a control signal sent to the valve in signal transmission line 536. Alternatively, the arc power to the ion source could be reduced. As a still further alternative, the residence time of the co-reactant gas could be reduced by increasing the flow rate thereof, by opening of valve 524 by control signal transmitted in signal transmission line 530 to the valve, and/or by adding cleaning fluid and/or diluent fluid so that overall increase in volumetric flow rate causes the residence time of the co-reactant gas in the flow circuitry and ion source chamber to be reduced. In this manner, the reaction of the co-reactant gas with the dopant source reactant can be controllably modulated, to provide for appropriate ion implantation system operation.

The present disclosure also relates to antimony, indium, and gallium precursor compositions, and to ion implantation apparatus and methods utilizing same for implantation of antimony, indium, and gallium implant species.

In one aspect, the present disclosure relates to a method of improving ion source life in an ion implantation system receiving at least one of antimony, indium and gallium precursor gases for generation of corresponding ionized dopant species, said method comprising co-flowing to an ion source chamber of the ion implantation system a co-flow gas that is effective to improve ion source life of the ion implantation system, wherein when the precursor gas is non-halogenated, the co-flow gas comprises a halogen-containing co-flow gas, and wherein when the precursor gas comprises a halogen-containing precursor, the co-flow gas is non-halogenated, optionally wherein at least one of the precursor gas, and co-flow gas when comprising a co-species gas, is isotopically enriched above natural abundance in at least one isotope thereof.

As used herein, the term "co-species gas" refers to a gas that contains a same dopant atom as the precursor gas. In other words, when the precursor gas comprises antimony as a dopant species, a co-species gas utilized therewith would comprise a gaseous antimony compound. Similarly, when the precursor gas comprises indium as a dopant species, a co-species gas utilized therewith would comprise a gaseous indium compound, and when the precursor gas comprises gallium as a dopant species, a co-species gas utilized therewith would comprise a gaseous gallium compound.

In the above-discussed method, the halogen-containing co-flow gas may comprise a fluorine-containing gas, e.g., a co-species fluorine-containing gas, such as antimony fluoride when the precursor gas comprises an antimony dopant species, indium fluoride when the precursor gas comprises an indium dopant species, and gallium fluoride when the precursor gas comprises a gallium dopant species. Alternatively, the halogen-containing co-flow gas may comprise a non-fluoro halogen gas, such as a chloride, iodide, or bromide gas.

In specific embodiments, the precursor gas may comprise an antimony precursor, e.g., $Sb_2O_3$. Such antimony precursor may be utilized with a co-flow gas comprising an antimony co-flow gas, such as $SbF_3$ or $SbH_3$. In other embodiments, the precursor gas may comprise an indium precursor or a gallium precursor, and such precursor gases may be used with appropriate co-flow gases, including co-species gases.

In various implementations, the method described above may be conducted with a co-flow gas such as $NF_3$ or $XeF_2$.

The foregoing method in other implementations may be carried out, wherein at least one of the precursor gas, and co-flow gas when comprising a co-species gas, is isotopically enriched above natural abundance in at least one isotope thereof. For example, the precursor gas may be isotopically enriched above natural abundance level, in at least one isotope thereof. As another example, the co-flow gas may comprise a co-species gas, and be isotopically enriched above natural abundance level in at least one isotope thereof. As a still further example, both of the precursor gas and co-flow gas comprising a co-species gas, may be isotopically enriched above natural abundance in at least one isotope thereof.

In a further aspect, the disclosure relates to a gas supply kit for ion implantation, comprising: a first gas supply package containing at least one of antimony, indium, and gallium precursors, wherein the first gas supply package is configured to dispense the precursor in gaseous form; a second gas supply package containing a co-flow gas that when co-flowed to an ion source of an ion implanter with the gaseous precursor, is effective to improve ion source life, wherein when the precursor is non-halogenated, the co-flow gas comprises a halogen-containing co-flow gas, and wherein when the precursor gas comprises a halogen-containing precursor, the co-flow gas is non-halogenated, optionally wherein at least one of the precursor gas, and co-flow gas when comprising a co-species gas, is isotopically enriched above natural abundance in at least one isotope thereof.

In an illustrative embodiment of such gas supply kit, the precursor in the first gas supply package may comprise $Sb_2O_3$, and the co-flow gas in the second gas supply package may comprise at least one of $SbF_3$, $NF_3$, and $XeF_2$.

The disclosure further contemplates a method of enhancing ion source life in ion implantation facilities, comprising supplying for use in the ion implantation facilities a gas supply kit as described above.

In another aspect, the disclosure relates to a gallium ion implantation process, comprising ionizing a gallium precursor to form gallium implant species, and implanting the gallium implant species in a substrate, wherein the gallium precursor comprises one or more precursor material selected from the group consisting of: (i) gallium halides selected from the group consisting of $GaF_3$, $GaCl_3$, $GaCl_2$, $GaBr_2$, and $GaI_3$; (ii) gallium hydrides selected from the group consisting of $GaH_3$, $Ga_2H_6$, and polymeric gallium hydrides comprising repeating units of the formula —$(GaH_3)$—; (iii) gallium adducts of the formula $L:GaR_3$ wherein L is an adducting group, and R is H or $C_1$-$C_{12}$ alkyl; (iv) alkylgallium compounds of the formula $GaR_3$ wherein R is $C_1$-$C_{12}$ alkyl; (v) chloroalkylgallanes of the formula $GaCl_yR_{3-y}$ wherein y is 1 or 2, and R is H or $C_1$-$C_{12}$ alkyl; and (vi) isotopically enriched analogs of (i) to (v) comprising gallium isotopically enriched above natural abundance in $^{69}Ga$ or $^{71}Ga$.

This gallium ion implantation process may be conducted, in which the gallium precursor comprises one or more precursor material selected from (i) gallium halides selected from the group consisting of $GaF_3$, $GaCl_3$, $GaCl_2$, $GaBr_2$, and $GaI_3$.

In other embodiments, the process may be conducted, wherein the gallium precursor comprises one or more precursor material selected from (ii) gallium hydrides selected from the group consisting of $GaH_3$, $Ga_2H_6$, and polymeric gallium hydrides comprising repeating units of the formula —$(GaH_3)$—. In various embodiments, such gallium precursor may be refrigerated and/or adsorbed prior to the ionization of the precursor. In the case in which the gallium precursor is adsorbed prior to the ionizing thereof, the precursor is desorbed for flow to the ionizing operation.

The foregoing gallium ion implantation process may be carried out with the gallium precursor comprising one or more precursor material selected from (iii) gallium adducts of the formula $L:GaR_3$ wherein L is an adducting group, and R is H or $C_1$-$C_{12}$ alkyl. The adducting group L may be of any suitable type, and may for example comprise a Lewis base. The gallium precursor may for example comprise $(CH_3)N:GaH_3$.

The foregoing gallium ion implantation process may be carried out with the gallium precursor comprising one or more precursor material selected from (iv) alkylgallium compounds of the formula $GaR_3$ wherein R is $C_1$-$C_{12}$ alkyl. The gallium precursor of such type may comprise $Ga(CH_3)_3$.

In other implementations of the foregoing gallium ion implantation process, the gallium precursor may comprise one or more precursor material selected from (v) chloroalkylgallanes of the formula $GaCl_yR_{3-y}$ wherein y is 1 or 2, and R is H or $C_1$-$C_{12}$ alkyl. The gallium precursor in such case may be stabilized by storage under nitrogen, hydrogen, or other inert gas prior to ionization thereof. $GaCl_2CH_3$ is an illustrative example of these chloroalkylgallane gallium precursor compounds.

In still other implementations of the foregoing gallium ion implantation process, the gallium precursor may comprise one or more precursor material selected from (vi) isotopically enriched analogs of (i) to (v) comprising gallium isotopically enriched above natural abundance in $^{69}Ga$ or $^{71}Ga$. Specific embodiments include the process wherein the gallium precursor is isotopically enriched above natural abundance in $^{69}$, and the process wherein the gallium precursor is isotopically enriched above natural abundance in $^{71}Ga$.

The disclosure in another aspect relates to an ion source apparatus for gallium ion implantation, comprising: an ion source chamber; and a source of gallium precursor configured for delivery of the gallium precursor to the ion source chamber, wherein the source of gallium precursor comprises one or more precursor material selected from the group consisting of: (i) gallium halides selected from the group consisting of $GaF_3$, $GaCl_3$, $GaCl_2$, $GaBr_2$, and $GaI_3$; (ii) gallium hydrides selected from the group consisting of $GaH_3$, $Ga_2H_6$, and polymeric gallium hydrides comprising repeating units of the formula —$(GaH_3)$—; (iii) gallium adducts of the formula L:$GaR_3$ wherein L is an adducting group, and R is H or $C_1$-$C_{12}$ alkyl; (iv) alkylgallium compounds of the formula $GaR_3$ wherein R is $C_1$-$C_{12}$ alkyl; (v) chloroalkylgallanes of the formula $GaCl_yR_{3-y}$ wherein y is 1 or 2, and R is H or $C_1$-$C_{12}$ alkyl; and (vi) isotopically enriched analogs of (i) to (v) comprising gallium isotopically enriched above natural abundance in $^{69}Ga$ or $^{71}Ga$.

The ion source apparatus may be constituted, with the source of gallium precursor comprises one or more precursor material selected from the group consisting of (i)-(iv). In other embodiments, the apparatus may comprise a source of gallium precursor comprising one or more precursor material selected from the group consisting of (v) chloroalkylgallanes. In still other embodiments, the apparatus may comprise a source of gallium precursor comprising one or more precursor material selected from the group consisting of isotopically enriched analogs of (i) to (v) comprising gallium isotopically enriched above natural abundance in $^{69}Ga$ or $^{71}Ga$.

Another aspect of the present disclosure relates to an ion implantation process, comprising ionizing a precursor to form implant species, and implanting the implant species in a substrate, wherein the precursor comprises one or more precursor material selected from the group consisting of: antimony precursors isotopically enriched above natural abundance in one of $^{121}Sb$ and $^{132}Sb$; indium precursors isotopically enriched above natural abundance in one of $^{113}In$ and $^{115}In$; and gallium precursors isotopically enriched above natural abundance in one of $^{69}Ga$ and $^{71}Ga$.

In various embodiments, this ion implantation process is conducted with the precursor material comprising an antimony precursor isotopically enriched in $^{121}Sb$ above 57.4%. For example, the amount of $^{121}Sb$ in a total amount of antimony in such precursor may be in a range having a lower limit selected from among 60%, 65%, 70%, 75%, 80%, 85%, 90%, and 95%, and an upper limit greater than the lower limit and selected from among 75%, 80%, 85%, 90%, 95%, 98%, 99%, 99.5%, 99.8%, 99.9%, and 100%. In specific implementations, the amount of $^{121}Sb$ in a total amount of antimony in the precursor may be in a range of from 60 to 100%.

All such isotopically enriched percentages referred to herein are atomic percentages.

The ion implantation process as broadly described above may be carried out with the precursor material comprising an antimony precursor isotopically enriched in $^{132}Sb$ above 46.6%. For example, the amount of $^{132}Sb$ in a total amount of antimony in the precursor may be in a range having a lower limit selected from among 50%, 55%, 60%, 65%, 70%, 75%, 80%, 85%, 90%, and 95%, and an upper limit greater than the lower limit and selected from among 75%, 80%, 85%, 90%, 95%, 98%, 99%, 99.5%, 99.8%, 99.9%, and 100%. In specific implementations, the amount of $^{132}Sb$ in a total amount of antimony in the precursor may be in a range of from 50% to 100%.

The ion implantation process as broadly described above alternatively may be carried out with the precursor material comprising an indium precursor isotopically enriched in $^{113}In$ above 4.3%. For example, the amount of $^{113}In$ in a total amount of indium in the precursor may be in a range having a lower limit selected from among 5%, 10%, 15%, 20%, 25%, 30%, 35%, 40%, 45%, 50%, 55%, 60%, 65%, 70%, 75%, 80%, 85%, 90%, and 95%, and an upper limit greater than the lower limit and selected from among 20%, 25%, 30%, 35%, 40%, 45%, 50%, 55%, 60%, 65%, 70%, 75%, 80%, 85%, 90%, 95%, 98%, 99%, 99.5%, 99.8%, 99.9%, and 100%. In specific implementations, the amount of $^{113}In$ in a total amount of indium in the precursor may be in a range of from 5% to 100%.

Alternatively, the ion implantation process may be carried out with the precursor material comprising an indium precursor isotopically enriched in $^{115}In$ above 95.7%. For example, the amount of $^{115}In$ in a total amount of indium in the precursor may be in a range having lower limit selected from among 96%, 96.5%, 97%, 97.5%, 98%, 98.5% 99%, 99.5%, 99.8%, 99.9%, and an upper limit greater than the lower limit and selected from among 98%, 98.5% 99%, 99.5%, 99.8%, 99.9%, 99.95%, and 100%. In specific implementations, the amount of $^{115}In$ in a total amount of indium in said precursor is in a range of from 96% to 100%.

The ion implantation process as broadly described above in a further aspect may be carried out with the precursor material comprising a gallium precursor isotopically enriched in $^{69}Ga$ above 60%. For example, the amount of $^{69}Ga$ in a total amount of gallium in the precursor may be in a range having a lower limit selected from among 65%, 70%, 75%, 80%, 85%, 90%, and 95%, and an upper limit greater than the lower limit and selected from among 75%, 80%, 85%, 90%, 95%, 98%, 99%, 99.5%, 99.8%, 99.9%, and 100%. In various embodiments, the amount of $^{69}Ga$ in a total amount of gallium in the precursor may be in a range of from 65% to 100%.

Alternatively, the ion implantation process broadly described above may be carried out with the precursor material comprising a gallium precursor isotopically enriched in $^{71}Ga$ above 40%. The amount of $^{71}Ga$ in a total amount of gallium in such precursor may be in a range having a lower limit selected from among 45%, 50%, 55%, 60%, 65%, 70%, 75%, 80%, 85%, 90%, and 95%, and an upper limit greater than the lower limit and selected from among 75%, 80%, 85%, 90%, 95%, 98%, 99%, 99.5%, 99.8%, 99.9%, and 100%. In a specific implementation, the amount of $^{71}Ga$ in a total amount of gallium in the precursor may be in a range of from 45% to 100%.

The disclosure in another aspect relates to a method of enhancing operation of an ion implantation system for implantation of at least one of antimony, indium, or gallium, such method comprising supplying for use in the system corresponding precursor material selected from the group consisting of: antimony precursors isotopically enriched above natural abundance in one of $^{121}$Sb and $^{132}$Sb; indium precursors isotopically enriched above natural abundance in one of $^{113}$In and $^{115}$In; and gallium precursors isotopically enriched above natural abundance in one of $^{69}$Ga and $^{71}$Ga.

In yet another aspect, the disclosure relates to an ion implantation system for implantation of at least one of antimony, indium, or gallium, such system comprising an ion source chamber, and a source of corresponding precursor material configured to provide the corresponding precursor material for ionization in the ion source chamber to generate corresponding implant species, wherein the source of corresponding precursor material comprises corresponding precursor material selected from the group consisting of: antimony precursors isotopically enriched above natural abundance in one of $^{121}$Sb and $^{132}$Sb; indium precursors isotopically enriched above natural abundance in one of $^{113}$In and $^{115}$In; and gallium precursors isotopically enriched above natural abundance in one of $^{69}$Ga and $^{71}$Ga.

Referring again to the drawings, the ion implant system schematically shown in FIG. 4 can be employed, utilizing a storage and dispensing vessel containing precursor which is supplied for ion implantation doping of a substrate in the illustrated ion implant chamber, in which the precursor comprises an antimony, indium, or gallium precursor composition of the present disclosure.

In such implementation, the FIG. 4 ion implant process system 300 includes a storage and dispensing vessel 302 holding an antimony, indium, or gallium precursor of the present disclosure, which is supplied to the ion source chamber 316 to generate dopant species for ion implantation doping of a substrate 328 in the ion implant chamber 301.

As previously described, the storage and dispensing vessel 302 comprises a vessel wall 306 enclosing an interior volume holding the precursor gas.

The vessel may be a gas cylinder of conventional type, with an interior volume arranged to hold only gas, or alternatively, the vessel may contain a sorbent material having sorptive affinity for the precursor gas, and from which the precursor gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may as previously discussed be coupled with the line, and interfaced with control means such as actuators, feedback and computer control systems, cycle timers, etc.

The ion implant chamber 301 contains an ion source chamber 316 receiving the dispensed precursor gas from line 312 in which the precursor is ionized to generate dopant species that under the ionization conditions in the chamber produce an ion beam 305. The ion beam 305 passes through the mass analyzer unit 322 which selects the ions needed and rejects the non-selected ions.

The selected ions pass through the acceleration electrode array 324 and then the deflection electrodes 326. The resultingly focused ion beam is impinged on the substrate element 328 disposed on the rotatable holder 330 mounted in turn on spindle 332, to form a doped substrate as the ion implantation product.

The respective sections of the ion implant chamber 301 are exhausted through lines 318, 340 and 344 by means of pumps 320, 342 and 346, respectively, as earlier described.

The present disclosure additionally relates to systems and processes for ion implantation of antimony.

Although the ion implantation systems and processes of the present disclosure are hereinafter primarily described in reference to beam line ion implantation systems and processes, it will be recognized that the antimony precursor approaches of the present disclosure are generally applicable to other ion implantation systems and processes, such as plasma immersion ion implantation. Accordingly, as used herein, the term "ion source" is intended to be broadly construed to encompass any chamber, reactor, or zone in which ionization of precursor is carried out to generate implant species for ion implantation.

More particularly, the present disclosure relates to use of stibine and/or deuterated analogs thereof as precursors for ion implantation.

Stibine heretofore has not been considered to be a commercially viable antimony precursor, instead being regarded as being too unstable for such use. Despite its unstable character, however, $SbH_3$ possesses significant vapor pressure.

The approach of the present disclosure enables stibine to be effectively utilized as a precursor for antimony implantation, by supplying it from a source in which the antimony precursor is maintained in an adsorbed state at temperature that minimizes or eliminates decomposition, being desorbed and flowed to the ion source of the ion implantation system for ionization to form antimony implant species.

The present disclosure in a related aspect utilizes deuterated stibine, i.e., $SbH_{3-x}D_x$ wherein x has a value in a range of from 1 to 3, as an antimony precursor. In various embodiments of the present disclosure, the deuterated stibine comprises $SbD_3$. Accordingly, references herein to deuterated analogs of stibine will be understood to refer to deuterated stibine of the foregoing formula $SbH_{3-x}D_x$. Such deuterated stibine may comprise a mixture of deuterated stibine compounds, e.g., a mixture of $SbH_2D$, $SbHD_2$, and $SbD_3$.

In the use of deuterated stibine, the ion implantation system utilizing such precursor is operated below an extraction voltage level at which neutron-generating nuclear reactions occur. In such application, the deuterated stibine precursor may be supplied from a source wherein such precursor is maintained in an adsorbed state, and is desorbed and flowed to the ion source for ionization to form antimony implant species.

Accordingly, the present disclosure contemplates an antimony ion implant process, comprising supplying antimony precursor to an ion source of an ion implantation system, for generation of antimony ions for implantation, wherein the antimony precursor comprises at least one of $SbH_3$ and deuterated analogs thereof, and wherein: (i) when the antimony precursor comprises $SbH_3$, the antimony precursor is supplied from a source wherein the antimony precursor is maintained in an adsorbed state at temperature that minimizes or eliminates decomposition, and is desorbed and flowed to the ion source for said supplying; and (ii) when the antimony precursor comprises a deuterated analog of stibine, the ion implantation system is configured to operate below an extraction voltage level at which neutron-generating nuclear reactions occur, optionally wherein the antimony precursor is supplied from a source wherein the antimony precursor is maintained in an adsorbed state, and is desorbed and flowed to the ion source for said supplying.

The foregoing process may be carried out wherein the antimony precursor comprises stibine, and the antimony precursor in an adsorbed state is cryogenically cooled to temperature that minimizes or eliminates decomposition. As used in such context, temperature that minimizes decomposition is a temperature at which less than 1% decomposition of the precursor takes place during a period of 3 months storage in such adsorbed state.

The antimony precursor in such process may be in an adsorbed state on any suitable adsorbent material having sorptive affinity for the precursor. Suitable adsorbent materials potentially useful in specific applications include, without limitation, silica, molecular sieves, macroreticulate polymers, carbon, alumina, and the like. Carbon is a preferred adsorbent material, having suitable reversible adsorption loading capacity for such purpose. Carbon materials of suitable character can be prepared with appropriate porosity characteristics and surface area, and may be disposed in a fluid storage and dispensing package as a storage medium for the antimony precursor. The antimony precursor then may be desorbed from the adsorbent for flow to the ion source chamber of the ion implantation system under dispensing conditions, by appropriate desorption modality, including pressure-mediated desorption, temperature-mediated desorption, desorption by exposure of the sorbate-containing adsorbent to a carrier gas for mass transfer gradient-mediated desorption, or a combination of two or more of such desorption modalities.

The foregoing process may be carried out with a deuterated analog of stibine, such as $SbD_3$. In such utilization, the ion implantation system may be operated to terminate flow of the deuterated stibine precursor if the extraction voltage of the ion implantation system is above the extraction voltage at which neutron-generating nuclear reactions occur.

The presence of deuterium in the antimony precursor entails the issue that deuterium atoms in the precursor can cause unwanted nuclear reactions when colliding with other deuterium atoms in the implanter. These nuclear reactions yield neutrons, which are difficult to detect, but below a certain extraction voltage, such nuclear reactions do not occur in any significant levels.

Accordingly, the present disclosure contemplates ion implantation systems utilizing deuterated stibine precursors for implantation of antimony, in which the system is configured to prevent the unwanted nuclear reactions producing deleterious neutrons. Such preventive features include the use of deuterated stibine gas supply packages equipped with pneumatic or solenoid-type control valves, or other suitable type valves, which are arranged to automatically close if the ion implantation tool or to be operated above a predetermined extraction voltage. This automatic closure may be effectuated via soft or hardwired interlocks, or in other suitable manner.

Further, the deuterated stibine precursor supply package may be constructed with particular connection structure so that the supply package can only be connected to a proper gas delivery line for transport of the deuterated stibine precursor to the ion source chamber of the ion implanter.

In addition, the deuterated stibine precursor package may be fabricated to include an RFID tag so that the ion implanter tool recognizes when a deuterated stibine precursor supply package is installed. Alternatively, use of a physical contact that would close when the package is installed, may be employed.

As a further preventive safety measure, the ion implant system may be configured so that when a deuterated stibine precursor supply package is installed, no process can be run on the ion implant system above a predetermined extraction voltage, or alternatively that the ion implant system is configured to operate only below a predetermined extraction voltage, regardless of the precursor that is used.

The deuterated stibine precursor may in addition to being adsorbed for supply to the ion implant tool may be cooled to minimize or eliminate decomposition, in the same manner described hereinabove in reference to stibine precursor per se.

Thus, in the aforementioned process in which deuterated stibine precursor is employed, and flow of the precursor to the ion source is terminated if extraction voltage of the ion implantation system is above the extraction voltage at which neutron-generating nuclear reactions occur, the termination flow may be effected by closure of the flow control valve in a gas delivery line in which the deuterated stibine precursor is flowed to the ion source. Alternatively, the process may be conducted, as discussed above, so that the deuterated stibine precursor is supplied from a source configured so that it can only be connected to a gas delivery line that enables the ion implantation system to operate below the extraction voltage level at which neutron-generating nuclear reactions occur.

The process may be conducted, with the deuterated stibine precursor being supplied from a source configured with an RFID tag that is communicative with an RFID tag reader operatively arranged with the ion implantation system so that the ion implantation system is constrained to operate below the extraction voltage level at which neutron-generating nuclear reactions occur. The communication link between the RFID tag and RFID tag reader may utilize a handheld RFID tag reader, e.g., a smartphone or other personal digital device including an application effectuating such link, or the RFID tag reader may be integrated as a stationary device in the process system, for reading the RFID tag on the precursor vessel at the time of installation of the precursor package in the ion implantation system.

The process may be conducted, with the deuterated stibine precursor being supplied from a source configured to constrain the ion implantation system to operate below the extraction voltage level at which neutron-generating nuclear reactions occur, when the source is installed for supplying precursor to the ion implanter tool.

As mentioned, the implant process may be conducted in an ion implantation system that is incapable of operation above the extraction voltage level at which neutron-generating nuclear reactions occur.

The deuterated stibine precursor may be supplied from a source in which the antimony precursor is maintained in an adsorbed state, e.g., on a carbon adsorbent in a gas storage and dispensing vessel containing the adsorbent in an interior volume thereof, with the deuterated stibine precursor being desorbed and flowed to the ion source for supply to the ion implanter tool.

The deuterated stibine precursor in the adsorbed state may be cryogenically cooled, e.g., by a liquid nitrogen refrigeration circuit operatively coupled with the deuterated stibine precursor storage and dispensing package, so that the adsorbent is maintained at appropriate low temperature consistent with suppression of decomposition thereof.

More generally, in the antimony precursor ion implantation process of the disclosure is broadly described hereinabove, the antimony precursor may be co-flowed to the ion source with a co-flow gas that is effective to improves source life of the ion source chamber. The co-flow gas may be of any suitable type for such purpose, and in specific embodiments may include a fluorine-containing co-flow gas. The antimony precursor in such co-flow arrangement may comprise stibine and/or deuterated stibine in the precursor composition.

The present disclosure correspondingly contemplates an antimony ion implantation system, comprising an ion source and a package of antimony precursor arranged to supply the antimony precursor to the ion source, wherein the antimony precursor in said package comprises at least one of $SbH_3$ and deuterated analogs thereof, and wherein: (i) when the antimony precursor comprises $SbH_3$, the package contains the antimony precursor in an adsorbed state, and the system comprises a refrigeration source configured to maintain the antimony precursor in the package at temperature that minimizes or eliminates decomposition, with the package being configured for desorption of the antimony precursor and discharge of the antimony precursor from the package for supply to the ion source; and (ii) when the antimony precursor comprises a deuterated stibine analog, the ion implantation system is configured to operate below an extraction voltage level at which neutron-generating nuclear reactions occur.

The antimony precursor in the implantation system thus may comprise $SbH_3$, and/or deuterated stibine analog(s), such as $SbD_3$, optionally wherein the package contains the antimony precursor in an adsorbed state, and further optionally wherein the system comprises a refrigeration source configured to maintain the antimony precursor in the package at temperature that minimizes or eliminates decomposition, with the package being configured for desorption of the antimony precursor and discharge of the antimony precursor from the package for supply to the ion source.

As a further variation, the antimony precursor contemplated by the present disclosure may comprise antimony precursor that is isotopically enriched above natural abundance in at least one isotope thereof. Such isotopically enriched stibine or deuterated stibine precursors may be usefully employed to improve beam current, ion source life, and other operating aspects of the ion implantation system.

The antimony precursor gas in the broad practice of the present disclosure may comprise stibine per se, one or more deuterated stibine analogs, or mixtures of stibine and deuterated stibine.

Referring again to the drawings, the process system shown in FIG. 4 may be deployed as an antimony ion implant process system including a storage and dispensing vessel containing stibine or deuterated stibine precursor which is supplied for ion implantation antimony doping of a substrate in the illustrated ion implant chamber.

In such adaptation, the ion implant process system 300 includes a storage and dispensing vessel 302 holding the stibine and/or deuterated stibine precursor, which is supplied to the ion source chamber 316 to generate antimony dopant species for ion implantation antimony doping of a substrate 328 in the illustrated ion implant chamber 301.

As previously described, the storage and dispensing vessel 302 comprises a vessel wall 306 enclosing an interior volume holding the precursor gas.

The vessel may be a gas cylinder of conventional type, with an interior volume containing a sorbent material having sorptive affinity for the antimony precursor gas, and from which the antimony precursor gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc., as earlier described.

The ion implant chamber 301 in such implementation contains an ion source chamber 316 receiving the dispensed stibine and/or deuterated stibine precursor gas from line 312 in which the precursor is ionized to generate antimony dopant species that under the ionization conditions in the chamber produce an ion beam 305. The ion beam 305 passes through the mass analyzer unit 322 which selects the ions needed and rejects the non-selected ions.

The selected ions pass through the acceleration electrode array 324 and then the deflection electrodes 326. The resultingly focused ion beam is impinged on the substrate element 328 disposed on the rotatable holder 330 mounted in turn on spindle 332, to form an antimony doped substrate as the ion implantation product.

As in the previously described employments of the FIG. 4 system, the respective sections of the ion implant chamber 301 are exhausted through lines 318, 340 and 344 by means of pumps 320, 342 and 346, respectively.

The ion implantation system 500 schematically shown in FIG. 6 may be employed in another operational use, as comprising an ion source chamber 544 and a process monitoring and control system, which may be adapted for antimony doping of a substrate, according to another embodiment of the disclosure.

In such adaptation, the ion implantation system 500 includes a gas box 510 in which are disposed gas supply cylinders including a stibine and/or deuterated stibine precursor cylinder 512, coupled to dispensing line 518 having flow control valve 524 therein, a co-flow gas cylinder 514 coupled to dispensing line 520 having a flow control valve 526 therein, and a diluent or cleaning fluid cylinder 516 coupled to dispensing line 522 having flow control valve 528 therein. The stibine and/or deuterated stibine precursor gas in cylinder 512 may be maintain in such vessel in an adsorbed state on carbon or other adsorbent, and the vessel may be cooled to suitable temperature for suppressing decomposition of the precursor gas therein, by suitable refrigeration equipment (not shown in FIG. 6).

As previously described, the valves 524, 526 and 528 are connected to a central processing unit (CPU) by signal transmission lines 530, 536 and 534, respectively, whereby the CPU can operate to open or close the respective valves to a specific extent in response to a cycle time program, or other signal generating capability of the CPU that provides a valve-modulating response to process conditions and/or components monitored by the CPU.

The dispensing lines 518, 520 and 522 coupled to the respective cylinders terminate at a mixing chamber 532, so that multiple ones of the respective precursor gas, co-flow gas and diluent or cleaning fluid can be selectively mixed with one another, as desired, or the respective fluids from the vessels can be sequentially flowed to the mixing chamber and subsequently to the ion source chamber. In a specific embodiment, the precursor gas cylinder 512 may be arranged to dispense the precursor to chamber 532 concurrently with flow of co-flow gas from the co-flow gas cylinder 514 to such chamber, for flow therefrom to the feed line containing pressure transducer 540 and mass flow controller (MFC) 542 therein, and thence to the ion source chamber 544, followed by flow of a cleaning fluid from cylinder 516 to the ion source chamber for cleaning thereof after the ion implantation operation has been concluded.

The ion source chamber 544 is arranged for ionization operation, to ionize the antimony dopant source therein. The ionization operation is conducted to produce an ion beam that is transmitted to the ion implanter chamber 546. The ion implanter chamber 546 may contain a semiconductor or other microelectronic device substrate mounted therein for implantation of the selected ionized dopant species in the substrate. Alternatively, the substrate may comprise a substrate for manufacture of a flat-panel display or solar panel.

In this illustrative system of FIG. 6, the pressure transducer 540 in the feed line to the ion source is joined in signal transmission relationship to the CPU by signal transmission line 538. The mass flow controller also is joined in signal transmission relationship to the CPU by a signal transmission line. By this arrangement of the pressure transducer, a signal is generated that is correlative of the pressure in the feed line, and transmitted in line 538 to the CPU for monitoring purposes.

During the flow of the antimony precursor to the ion source, pressure in the feed line is sensed by the pressure transducer 540 and transmitted in signal transmission line 538 to the CPU.

The CPU then responsively can modulate flow of the co-flow gas to the ion source chamber. The CPU also can control flow of the cleaning fluid into the feed line from cylinder 514 by opening the flow control valve 526 by a control signal sent to the valve in signal transmission line 536. Alternatively, the arc power to the ion source could be reduced. As a still further alternative, the residence time of the precursor gas could be reduced by increasing the flow rate thereof, by opening of valve 524 by control signal transmitted in signal transmission line 530 to the valve, and/or by adding co-flow gas and/or diluent fluid so that overall increase in volumetric flow rate causes the residence time of the antimony precursor gas in the flow circuitry and ion source chamber to be reduced. In this manner, the flow rate of the antimony precursor gas and co-flow gas can be controllably modulated, to provide for appropriate ion implantation system operation.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. An ion source apparatus for ion implantation, comprising:
    an ion source chamber; and
        a consumable structure in or associated with the ion source chamber, said consumable structure comprising a solid dopant source material susceptible to reaction with a reactive gas for release of dopant in gaseous form to the ion source chamber, wherein the consumable structure comprises a structural member disposed in the ion source chamber, the structural member comprising a base liner with a hole disposed of the ion source chamber.

2. The ion source apparatus of claim 1, wherein the consumable structure comprises a gas delivery tube coupled to the ion source chamber.

3. The ion source apparatus of claim 1, wherein the solid dopant source material comprises a dopant component selected from the group consisting of antimony, indium, and gallium.

4. The ion source apparatus of claim 1, further comprising a source of reactive gas coupled in gas delivery relationship to the ion source chamber.

5. The ion source apparatus of claim 4, wherein the source of reactive gas comprises gas selected from the group consisting of hydrogen fluoride, $NF_3$, oxygen, hydrogen, and mixtures of two or more of the foregoing.

6. The ion source apparatus of claim 1, wherein the solid dopant source material comprises an antimony dopant precursor.

7. The ion source apparatus of claim 1, wherein the solid dopant source material comprises a gallium dopant precursor.

8. The ion source apparatus of claim 1, wherein the solid dopant source material comprises an indium dopant precursor.

9. A method of conducting ion implantation, comprising:
    generating ionized dopant species in an ion source chamber for said ion implantation, wherein the ion source chamber has a consumable structure in associated therewith, and wherein the consumable structure comprises a solid dopant source material susceptible to reaction with a reactive gas for release of dopant in gaseous form to the ion source chamber for ionization therein to form said ionized dopant species, said method comprising contacting the consumable structure with the reactant gas for said generating of ionized dopant species, wherein the consumable structure comprises a structural member disposed in the ion source chamber, the structural member comprising a base liner of the ion source chamber.

10. The method of claim 9, wherein the consumable structure comprises a gas delivery tube coupled to the ion source chamber.

11. The method of claim 9, wherein the solid dopant source material comprises a dopant component selected from the group consisting of antimony, indium, and gallium.

12. The method of claim 9, wherein the reactive gas comprises gas selected from the group consisting of hydrogen fluoride, $NF_3$, oxygen, hydrogen, and mixtures of two or more of the foregoing.

13. The method of claim 9, wherein the solid dopant source material comprises an antimony dopant precursor.

14. The method of claim 9, wherein the solid dopant source material comprises a gallium dopant precursor.

15. The method of claim 9, wherein the solid dopant source material comprises an indium dopant precursor.

* * * * *